United States Patent
Hinshaw et al.

[11] Patent Number: 5,897,917
[45] Date of Patent: Apr. 27, 1999

[54] PRE-APPLICATION OF GREASE TO HEAT SINKS WITH A PROTECTIVE COATING

[75] Inventors: Howard G. Hinshaw, Dallas; Matthew C. Smithers, Lewisville, both of Tex.

[73] Assignee: Thermalloy, Inc., Dallas, Tex.

[21] Appl. No.: 08/910,314

[22] Filed: Aug. 13, 1997

Related U.S. Application Data

[62] Division of application No. 08/669,875, Jun. 21, 1996.

[51] Int. Cl.$^6$ .............. B05D 1/32; B05D 1/36; B05D 5/00
[52] U.S. Cl. .............. 422/258; 165/185; 427/259; 427/282
[58] Field of Search .............. 165/185; 361/705, 361/706, 708; 427/258, 282, 259; 428/266

[56] References Cited

U.S. PATENT DOCUMENTS

| | | | |
|---|---|---|---|
| 2,643,964 | 6/1953 | Smith-Johannsen | 428/266 |
| 2,711,382 | 6/1955 | Smith-Johannsen | 165/185 |
| 3,301,315 | 1/1967 | Webb | 165/185 |
| 3,509,429 | 4/1970 | Craig et al. | 165/185 X |
| 3,972,821 | 8/1976 | Weidenbenner et al. | 165/185 X |
| 4,602,678 | 7/1986 | Fick | 165/185 X |
| 5,168,926 | 12/1992 | Watson et al. | 165/185 |

FOREIGN PATENT DOCUMENTS

WO 95/02505  1/1995  WIPO.

OTHER PUBLICATIONS

Thermalloy, Inc. catalog, "The Best Thermal Management Solutions from Around the World", Nov., 1996, pp. A2–A7 and D9–D11.

*Primary Examiner*—Michael Lusignan
*Attorney, Agent, or Firm*—Woodcock Washburn Kurtz Mackiewicz & Norris LLP

[57] ABSTRACT

Heat sinks pre-coated with a layer of a material such as thermal grease are disclosed. Contamination and migration of the thermal grease is substantially reduced by covering the coated areas with a protective film that is removed prior to the assembly of the heat sink into a circuit board or other assembly. By providing a pre-coated heat sink, productivity can be enhanced, by increasing accuracy with which the thermal grease is applied, thus eliminating waste and clean up. Methods for pre-coating either a heat sink or the protective film with thermal grease are also disclosed. In preferred embodiments areas of the heat sink can be either fully coated,, or portions electively coated, and the coating is most preferably accomplished by a silk screening or pad printing process. The protective film is preferably provided with a tear off tab to facilitate the removal of the protective film. The present invention also discloses improved methods of installing a heat sink using heat sinks that are pre-coated with thermal grease.

14 Claims, 1 Drawing Sheet

PRE-APPLICATION OF GREASE TO HEAT SINKS WITH A PROTECTIVE COATING

This is a division of application Ser. No. 08/669,875, filed Jun. 21, 1996, the disclosure of which is herein incorporated by reference.

The present invention relates to electronic component assemblies, and more particularly relates to the application of a substance such as thermally conductive grease between two components.

BACKGROUND OF THE INVENTION

The interface between a heat sink and the component to which it is attached creates a boundary layer of thermal insulation. This reduces the thermal transmisivity to the heat sink, and thus ultimately reduces the ability of the heat sink to dissipate heat generated by the component. In the past, it has been found that applying a film of thermal grease can diminish or substantially eliminate this problem. Thermal grease is well known in the art and can be a composition of silicone and zinc oxide, available from Dow Corning of Midland, Mich. and other sources. Another thermal grease composition, Thermalcote™ is available from Thermalloy, Inc. of Dallas, Tex.; another a product sold by the same company and known as Thermalcote II™ does not contain silicone. The Thermalcote products are available in forms that are applied by brush, squeezed out of a tube, applied by a paddle, or other techniques. Unfortunately, the application of thermal grease to individual components in a production environment is laborious and inexact. Nonetheless, despite numerous efforts to create another interface material to replace it, thermal grease remains the most effective product for ensuring good thermal conductivity.

Thermal grease can be applied directly to an insulator strip. The coated strip is supplied in a package that must be peeled away, and the insulator must then be applied to a component. This product is sold under the name Insul-Cote by Thermalloy, Inc. of Dallas, Tex. Similarly, it is known to apply a thin layer of thermal grease to both sides an aluminum carrier that is 0.1 mm (0.004") thick. The coated carrier is then disposed between a heat sink and a microprocessor. This product is sold under the name Conductacote(™) by Thermalloy, Inc. of Dallas, Tex. However, the use of such coated insulators or aluminum carriers does not eliminate the above-mentioned problems, since handling the grease-coated insulation or carrier is nearly as difficult as applying the grease from a tube or with a brush. The insulators and carriers can be obtained in strip form and applied by a machine, which alleviates some of these problems. However, this adds a production step and the capital cost of the application machine if the supplier of the pre-coated insulators or carriers does not provide one. The advantage of pre-coated insulators or carriers is that they apply a specific amount of grease, and a specific quantity of grease may be purchased by ordering coated insulators or carriers on a one-to-one basis with the heat sinks. However, a disadvantage of the above-described pre-coated insulators and aluminum carriers that are pre-coated with thermal grease is that they are difficult to manufacture.

As mentioned above, others in the art have attempted to create pads of material that serve as a replacement for thermal grease. Some of these products are insulating, while some more recent versions are not. Although such pads reduce the waste and inaccurate application related to the use of a thermal enhancement product, they are often more expensive and do not offer the thermal performance of grease. Therefore, it would be desirable to provide a product in which the thermal properties of grease are advantageously available to create a better thermal connection between a heat sink and a heat-emitting component. Moreover, it would be further desirable to reduce or eliminate waste, spillage and over-application of thermal grease. It is therefore an object of the present invention to provide products and methods in which thermal grease is applied in a precise and controlled manner. It is a further object of the present invention to provide products and methods that readily adapt to production environments and that do not require significant alteration of existing production sequences or changes in production tooling.

SUMMARY OF THE INVENTION

It has now been found that these and other objects of the present invention are met by pre-applying coatings and substances such as thermal grease to components such as heat sinks. The relevant area is covered with a protective sheet, e.g., a thin film or paper. The assembler removes the protective sheet, preferably using a tear off tab provided for that purpose. After the protective film is removed, the heat sink is assembled to a microprocessor or other semiconductor device, or any source of heat. Alternatively, the protective film or paper can be precoated and applied to the component.

The present invention therefore discloses heat sinks or proactive films that are pre-coated with a layer of a material such as thermal grease that provide several advantages over the prior art. For one, contamination and migration of the thermal grease is substantially reduced by covering the coated areas with a protective film that is removed prior to the assembly of the heat sink into a circuit board or other assembly. By providing a pre-coated heat sink, productivity is enhanced by increasing accuracy with which the thermal grease is applied, thus eliminating waste and clean up. The present invention is thus also directed to improved methods for pre-coating a heat sink with thermal grease in which areas of the heat sink can be either fully coated, or portions electively coated; alternatively, the protective film can be pre-coated. The coating is most preferably accomplished by a silk screening process or a pad printing process. The protective film is most preferably provided with a tear off tab to facilitate the removal of the protective film. Finally, the present invention also discloses improved methods of installing a heat sink using heat sinks that have an area where thermal grease is pre-applied and covered by a protective film.

DETAILED DESCRIPTION OF THE PREFERRED EMBODIMENTS

Figure 1:
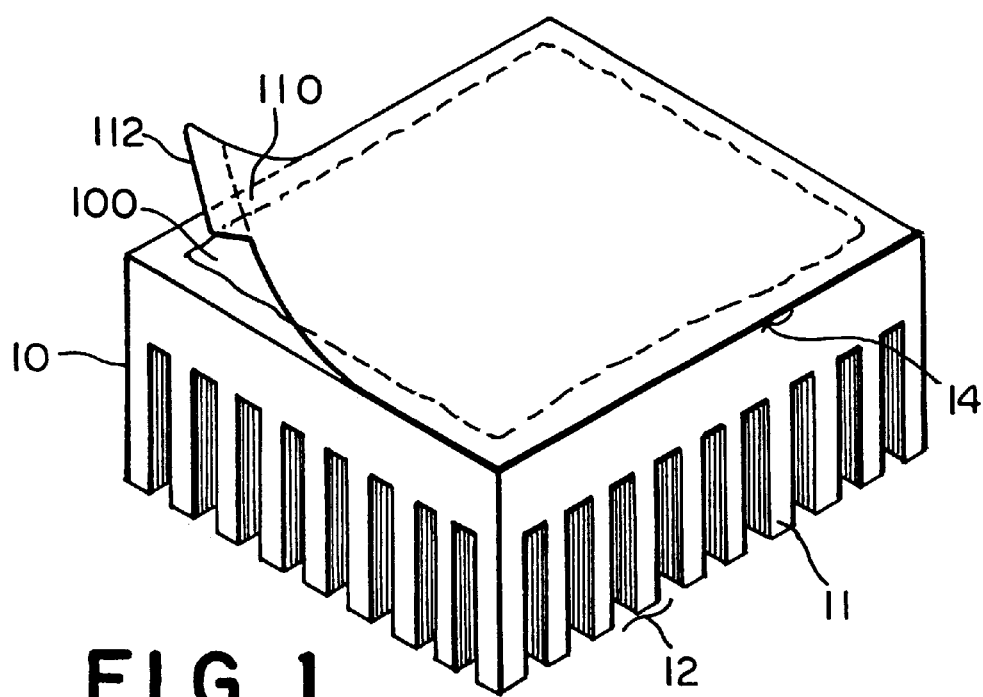
FIG. 1 is a perspective view of a preferred embodiment of the present invention.

Referring now to FIG. 1, in a preferred embodiment, a heat sink 10 comprises a plurality of fins 11 extending from a heat dissipation side 12 and a component facing side 14 opposite the heat dissipation side 12. The component facing side 14 is covered with a layer of material 100 and a protective film 110 overlies the layer of material 100. For purposes of illustration, FIG. 1 shows one corner of the protective film 110 upturned to expose the layer of material 100. It will be understood, however, that the heat sink 10 is normally delivered with a sheet of protective material overlying the layer of material 100.

The layer of material 100 most preferably comprises a thermal grease, the use of which is well known in the art as discussed above. It will be realized, however, that thermal grease is not the only type of material that can utilize the concepts disclosed herein. Numerous other property enhancing coatings, such s conductive powders, gels, dispersions, etc. can be used, as well as compliant coatings that absorb shock. In FIG. 1, the layer of material 100 is shown in phantom except where the protective film 110 is again shown as being lifted up for purposes of illustration.

Figure 2:
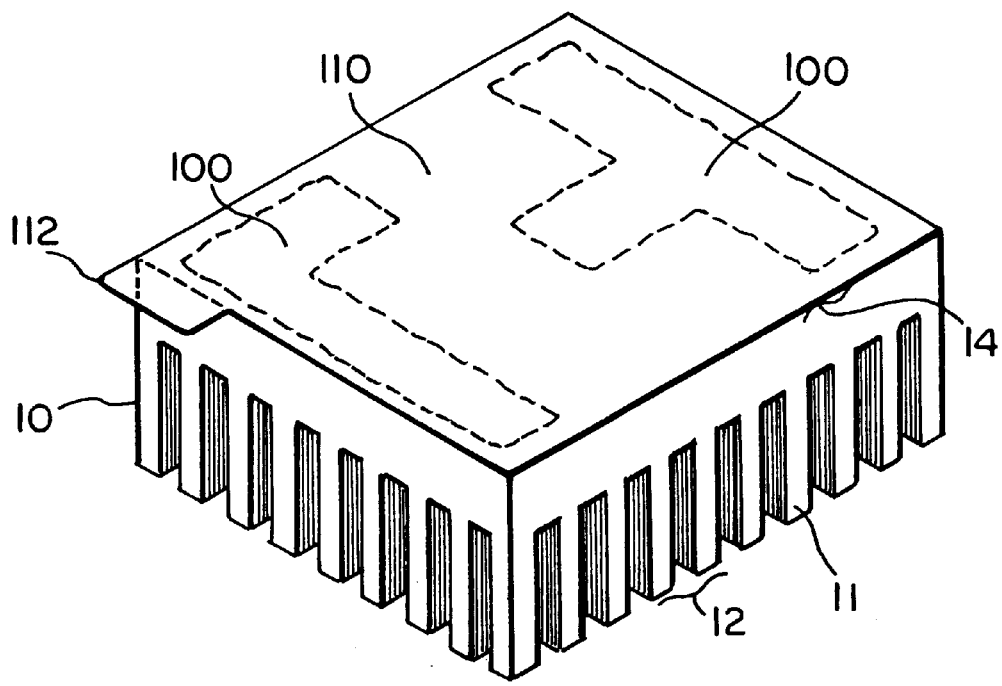
FIG. 2 is a perspective view of an alternate embodiment of the present invention.

In most embodiments, the layer of material 100 is applied over substantially the entire component facing side 14 as shown in FIG. 1. However, as seen in FIG. 2, the layer of material 100 alternatively can be applied over selected portions of the component facing side 14. In certain preferred embodiments, protective film 110 is adhered to the layer of material at one or more edges of the component facing side 14. In the embodiment illustrated in FIG. 2 the areas that are coated with the material 100 are shown in phantom. In either the embodiment of FIG. 1 or FIG. 2, it is preferred that the protective film 110 overlies the entire component facing side 14, although it will be understood that the present invention contemplates embodiments in which the protective film 110 is discontinuous, made of several sections, slit, perforated, or otherwise does not cover the entire component facing side 14. In certain preferred embodiments, at least a portion of the protective film 110 extends beyond an edge of the heat sink 10. Most preferably, a portion of the protective film 110 extends beyond an edge of the heat sink 10 and forms a removal tab 112.

The present invention contemplates that the protective film 110 can be made from any suitable material. As will be readily appreciated by those of skill in the art, suitable materials include those that are easily released from the component, that resist deterioration due to exposure with the thermal grease, and those that resist absorption of the thermal grease, in order to keep the external packaging free of contamination and to preserve the precise quantity of grease that has been applied. In preferred embodiments, the protective film 110 comprises a transparent material, but may alternatively be made from a coated paper product.

In another aspect of the present invention improved methods of applying thermal grease to a heat sink are disclosed. In a preferred embodiment, the methods of the present invention comprise the steps of identifying an area to receive thermal grease and applying thermal grease to the area. The thermal grease is then covered with a protective film. An alternative embodiment of the present invention involves applying thermal grease to pre-selected areas of the protective film, and then applying the coated thermal film to the heat sink or other component such that the grease coated side of the film comes into contact with the component.

As will be realized by those of skill in the art, there are a number of techniques for applying thermal grease to the surface of a heat sink in accordance with the present invention. One technique, which represents a preferred embodiment of the present invention is to silk screen the grease on to the surface of the heat sink. In another preferred embodiment, pad printing can also be sued in place of silk screening. In this embodiment a rubber pad or other suitable carrier is coated with grease and applied to either the component or the protective film. When the pad is removed, a "printed" area of thermal grease will be deposited in the appropriate area. The determination of the thickness of the coating can be easily determined by trial and error, and will not require undue amounts of experimentation.

Whether the thermal grease is applied by silk screening or by other techniques, the present invention contemplates methods wherein discrete areas are selectively coated, as well as methods in which an entire surface of a component is coated. After the grease has been applied, the step of covering the thermal grease is undertaken, and this preferably comprises applying a plastic film, coated paper or other film over the thermal grease.

Additionally, as explained above, although it is preferred that the component be coated with thermal grease, application are envisioned wherein the protective film will be coated first, and then the coated film applied to the component.

Another aspect of the present invention is the disclosure of improved methods for installing a heat sink. In accordance with this aspect of the present invention, a protective backing is removed from the heat sink, and the heat sink is installed. Preferably, the step of removing a protective backing comprises the step of grasping a tear off tab, which, as discussed above, is supplied with preferred embodiments of the present invention.

It will be understood that although the foregoing description of the preferred embodiments of the present invention focused upon the application of a material such as thermal grease to a heat sink, and then applying a protective film over the thermal grease, the present invention is equally applicable to and is directed to embodiments wherein the protective film 110 si first coated, continuously or discontinuously, with a coating such as thermal grease, and then the protective film 110 or a portion of it is applied to the back of a components such as a heat sink.

Although certain embodiments of the present invention have been disclosed and described with particularity, these embodiments are provided for the purpose of illustrating the invention and are not meant to be limiting. Upon review of the foregoing specification, those of skill in the art will immediately realize that numerous variations, modifications and adaptations of the invention are possible. Although differing in form and function, such alternate embodiments will employ the spirit of the present invention and are encompassed by the same. Accordingly, reference should be made to the appended claims in order to determine the full scope of the present invention.

What is claimed is:

1. A method of applying thermal grease to a heat sink, comprising the steps of:

identifying an area to receive thermal grease;

applying thermal grease to the area; and covering the thermal grease with a protective film.

2. The method of claim 1, wherein the step of applying thermal grease to the area comprises the step of silk screening.

3. The method of claim 1, wherein the step of applying thermal grease to the area comprises the step of printing with a pad.

4. The method of claim 1, wherein the step of applying thermal grease to the area comprises selectively coating discrete areas of a component.

5. The method of claim 1, wherein the step of applying thermal grease to the area comprises coating an entire surface of a component.

6. The method of claim 1, wherein the step of applying thermal grease to the area comprises the step of applying thermal grease to a protective backing.

7. The method of claim 1 wherein the thermal grease is adapted to enable the heat sink to be removable from a component to which the heat sink is mounted after prolonged use.

8. The method of claim 7 wherein the thermal grease is substantially nonadhesive.

9. The method of claim 7 wherein the thermal grease remains substantially uncured into an adhesive at temperatures below 93° C.

10. A method of applying thermal grease to a heat sink, comprising the steps of:

identifying an area to receive the thermal grease;

applying the thermal grease to the area, the thermal grease adapted for use without a heat curing step; and covering the thermal grease with a protective film.

11. The method of claim 10 wherein the thermal grease lacks a heat curing step during each one of the steps of applying the grease and installing the heat sink to a component, and during prolonged operation of the heat sink and the component.

12. The method of claim 10 wherein the thermal grease is adapted to enable the heat sink to be removable from a component to which the heat sink is mounted after prolonged use.

13. The method of claim 12 wherein the thermal grease is substantially nonadhesive.

14. The method of claim 12 wherein the thermal grease remains substantially uncured into an adhesive at temperatures below 93° C.

* * * * *